US008029881B2

(12) United States Patent
Surace et al.

(10) Patent No.: US 8,029,881 B2
(45) Date of Patent: Oct. 4, 2011

(54) RADIO FREQUENCY WAVE REDUCING MATERIAL AND METHODS FOR MANUFACTURING SAME

(75) Inventors: Kevin J. Surace, Sunnyvale, CA (US); Brandon D. Tinianov, Santa Clara, CA (US); Marc U. Porat, Beverly Hills, CA (US)

(73) Assignee: Serious Energy, Inc., Sunnyvale, CA (US)

( * ) Notice: Subject to any disclaimer, the term of this patent is extended or adjusted under 35 U.S.C. 154(b) by 1096 days.

(21) Appl. No.: 11/267,957

(22) Filed: Nov. 4, 2005

(65) Prior Publication Data

US 2007/0107350 A1    May 17, 2007

(51) Int. Cl.
*B32B 3/06*        (2006.01)
*B32B 23/02*       (2006.01)
(52) U.S. Cl. .......................................... 428/99; 428/192
(58) Field of Classification Search ................ 428/99, 428/192

See application file for complete search history.

(56) References Cited

U.S. PATENT DOCUMENTS

| | | |
|---|---|---|
| 2,811,906 A | 11/1957 | Chappell |
| 3,092,250 A | 6/1963 | Knutson et al. |
| 3,160,549 A | 12/1964 | Caldwell et al. |
| 3,215,225 A | 11/1965 | Kirschner |
| 3,336,710 A | 8/1967 | Raynes |
| 3,399,104 A | 8/1968 | Ball, III et al. |
| 3,424,270 A | 1/1969 | Hartman et al. |
| 3,462,899 A | 8/1969 | Sherman |
| 3,579,941 A | 5/1971 | Tibbals |
| 3,642,511 A | 2/1972 | Cohn et al. |
| 3,652,360 A | 3/1972 | Hartman et al. |
| 3,828,504 A | 8/1974 | Egerborg et al. |
| 4,003,752 A | 1/1977 | Osohata et al. |
| 4,112,176 A | 9/1978 | Bailey |
| 4,156,615 A | 5/1979 | Cukier et al. |
| 4,259,220 A | 3/1981 | Bunnelle et al. |
| 4,347,912 A | 9/1982 | Flocke et al. |
| 4,364,017 A | 12/1982 | Tokunaga et al. |

(Continued)

FOREIGN PATENT DOCUMENTS

CA    2219785    10/1996

(Continued)

OTHER PUBLICATIONS

Supplementary European Search Report, Application No. EP 06 82 7584, dated Nov. 4, 2009.

(Continued)

*Primary Examiner* — Kevin R. Kruer
(74) *Attorney, Agent, or Firm* — Haynes and Boone LLP (57) ABSTRACT

An improved radio frequency wave attenuating wall (ceiling or floor) or door material comprises a laminated structure having as an integral part thereof one or more layers of a viscoelastic material which also functions as a glue and one or more electrically conducting layers. An electrically conducting material such as tape or a formed metal channel provides an electrical connection between the electrically conducting material and an exposed outer surface of the laminated structure. In one embodiment the electrically conducting material is paint. In one embodiment, standard wallboard, typically gypsum, comprises the external surfaces of the laminated structure and one or more conductive layers are constructed between the gypsum exterior. In one embodiment, the conducting layer material is selected to provide physical security in addition to radio frequency wave attenuation. The construction is such that acoustical attenuation is also achieved.

25 Claims, 10 Drawing Sheets

U.S. PATENT DOCUMENTS

| | | | |
|---|---|---|---|
| 4,375,516 A | 3/1983 | Barrall | |
| 4,412,255 A | 10/1983 | Kuhlman et al. | |
| 4,487,793 A | 12/1984 | Haines et al. | |
| 4,618,370 A | 10/1986 | Green et al. | |
| 4,642,951 A | 2/1987 | Mortimer | |
| 4,663,224 A | 5/1987 | Tabata et al. | |
| 4,678,515 A | 7/1987 | Green et al. | |
| 4,685,259 A | 8/1987 | Eberhart et al. | |
| 4,719,261 A | 1/1988 | Bunnelle et al. | |
| 4,759,164 A | 7/1988 | Abendroth et al. | |
| 4,778,028 A | 10/1988 | Staley | |
| 4,786,543 A | 11/1988 | Ferm | |
| 4,791,044 A | 12/1988 | Yoshino | |
| 4,806,703 A | 2/1989 | Sims | |
| 4,924,969 A | 5/1990 | K'Heureux | |
| 4,941,207 A | 7/1990 | Maeda et al. | |
| 4,956,321 A | 9/1990 | Barrall | |
| 4,965,408 A * | 10/1990 | Chapman et al. | 174/363 |
| 4,967,530 A | 11/1990 | Clunn | |
| 4,977,926 A * | 12/1990 | Hocking | 137/512.1 |
| 5,016,413 A | 5/1991 | Counihan | |
| 5,026,593 A | 6/1991 | O'Brien | |
| 5,033,247 A | 7/1991 | Clunn | |
| 5,063,098 A * | 11/1991 | Niwa et al. | 428/76 |
| 5,110,660 A | 5/1992 | Wolf et al. | |
| 5,125,475 A | 6/1992 | Ducharme et al. | |
| 5,158,612 A | 10/1992 | Savoly et al. | |
| 5,240,639 A | 8/1993 | Diez et al. | |
| 5,256,223 A | 10/1993 | Alberts et al. | |
| 5,258,585 A | 11/1993 | Juriga | |
| 5,334,806 A | 8/1994 | Avery | |
| 5,342,465 A | 8/1994 | Bronowicki et al. | |
| 5,368,914 A | 11/1994 | Barrett | |
| 5,439,735 A | 8/1995 | Jamison | |
| 5,473,122 A | 12/1995 | Kodiyalam et al. | |
| 5,474,840 A | 12/1995 | Landin | |
| 5,496,966 A | 3/1996 | Hightower et al. | |
| 5,502,931 A | 4/1996 | Munir | |
| 5,585,178 A | 12/1996 | Calhoun et al. | |
| 5,595,801 A * | 1/1997 | Fahy et al. | 428/40.1 |
| 5,603,192 A | 2/1997 | Dickson | |
| 5,629,503 A | 5/1997 | Thomasen | |
| 5,643,666 A | 7/1997 | Eckart et al. | |
| 5,644,880 A | 7/1997 | Lehnert et al. | |
| 5,664,397 A | 9/1997 | Holz | |
| 5,691,037 A | 11/1997 | McCutcheon et al. | |
| 5,695,867 A | 12/1997 | Saitoh et al. | |
| 5,768,841 A | 6/1998 | Swartz et al. | |
| 5,824,973 A | 10/1998 | Haines et al. | |
| 5,827,609 A | 10/1998 | Ercillo et al. | |
| 5,867,957 A | 2/1999 | Holtrop | |
| 5,910,082 A | 6/1999 | Bender et al. | |
| 5,945,208 A | 8/1999 | Richards et al. | |
| 5,945,643 A | 8/1999 | Casser | |
| 5,954,497 A | 9/1999 | Cloud et al. | |
| 6,077,613 A | 6/2000 | Gaffigan | |
| 6,103,640 A * | 8/2000 | Yoshikawa et al. | 442/16 |
| 6,123,171 A | 9/2000 | McNett et al. | |
| 6,213,252 B1 | 4/2001 | Ducharme | |
| 6,240,704 B1 | 6/2001 | Porter | |
| 6,266,427 B1 | 7/2001 | Mathur | |
| 6,286,280 B1 | 9/2001 | Fahmy et al. | |
| 6,290,021 B1 | 9/2001 | Standgaard | |
| 6,309,985 B1 | 10/2001 | Virnelson et al. | |
| 6,342,284 B1 | 1/2002 | Yu | |
| 6,381,196 B1 | 4/2002 | Hein et al. | |
| 6,389,771 B1 | 5/2002 | Moller | |
| 6,443,256 B1 | 9/2002 | Baig | |
| 6,536,555 B1 | 3/2003 | Kelsic et al. | |
| 6,632,550 B1 | 10/2003 | Yu et al. | |
| 6,676,744 B2 | 1/2004 | Merkley et al. | |
| 6,699,426 B1 | 3/2004 | Burke | |
| 6,715,241 B2 | 4/2004 | Gelin et al. | |
| 6,758,305 B2 | 7/2004 | Gelin et al. | |
| 6,790,520 B1 | 9/2004 | Todd et al. | |
| 6,790,525 B2 | 9/2004 | Takeuchi et al. | |
| 6,800,161 B2 | 10/2004 | Takigawa | |
| 6,803,110 B2 | 10/2004 | Drees et al. | |
| 6,815,049 B2 | 11/2004 | Veramasuneni | |
| 6,822,033 B2 | 11/2004 | Yu | |
| 6,825,137 B2 | 11/2004 | Fu et al. | |
| 6,877,585 B2 | 4/2005 | Tinianov | |
| 6,913,667 B2 | 7/2005 | Nudo et al. | |
| 6,920,723 B2 | 7/2005 | Downey | |
| 6,941,720 B2 | 9/2005 | DeFord et al. | |
| 7,012,190 B1 * | 3/2006 | Price | 174/384 |
| 7,041,377 B2 | 5/2006 | Miura et al. | |
| 7,068,033 B2 | 6/2006 | Sellers et al. | |
| 7,160,610 B2 | 1/2007 | Takeuchi et al. | |
| 7,181,891 B2 * | 2/2007 | Surace et al. | 52/642 |
| 7,197,855 B2 | 4/2007 | Della Pepa | |
| 7,307,223 B2 * | 12/2007 | Tyson et al. | 174/372 |
| 2003/0006090 A1 | 1/2003 | Reed | |
| 2003/0070367 A1 | 4/2003 | Gelin et al. | |
| 2003/0117787 A1 * | 6/2003 | Nakauchi | 361/818 |
| 2004/0016184 A1 | 1/2004 | Huebsch et al. | |
| 2004/0168853 A1 | 9/2004 | Gunasekera et al. | |
| 2004/0177590 A1 | 9/2004 | Nudo et al. | |
| 2004/0214008 A1 | 10/2004 | Dobrusky et al. | |
| 2005/0040825 A1 | 2/2005 | Sellers et al. | |
| 2005/0050846 A1 * | 3/2005 | Surace et al. | 52/782.1 |
| 2005/0080193 A1 | 4/2005 | Wouters et al. | |
| 2005/0103568 A1 | 5/2005 | Sapoval et al. | |
| 2006/0048682 A1 | 3/2006 | Wagh et al. | |
| 2006/0057345 A1 * | 3/2006 | Surace et al. | 428/213 |
| 2006/0059806 A1 | 3/2006 | Gosling et al. | |
| 2006/0108175 A1 | 5/2006 | Surace et al. | |
| 2007/0094950 A1 | 5/2007 | Surace et al. | |
| 2007/0107350 A1 | 5/2007 | Surace et al. | |
| 2008/0264721 A1 | 10/2008 | Tinianov et al. | |
| 2009/0000245 A1 | 1/2009 | Tinianov et al. | |
| 2009/0000866 A1 | 1/2009 | Tinianov | |
| 2009/0004448 A1 | 1/2009 | Tinianov | |

FOREIGN PATENT DOCUMENTS

| | | |
|---|---|---|
| CN | 2134439 Y | 5/1993 |
| EP | 0412816 A | 2/1991 |
| EP | 1154087 B1 | 11/2001 |
| EP | 133 836 A | 2/2004 |
| JP | 02-117825 A | 5/1990 |
| JP | 06-250669 A | 9/1994 |
| JP | 07-506158 A | 7/1995 |
| JP | 08-156173 A | 6/1996 |
| JP | 09-203153 | 8/1997 |
| JP | 10-054096 A | 2/1998 |
| JP | 11-219186 A | 8/1999 |
| JP | 2001-522751 A | 11/2001 |
| JP | 2002-520544 A | 7/2002 |
| JP | 2003-071834 A | 3/2003 |
| WO | WO 96/34261 | 10/1996 |
| WO | WO 97/19033 | 5/1997 |
| WO | 99/24290 A | 5/1999 |
| WO | 00/02204 A | 1/2000 |
| WO | WO 00/24690 | 5/2000 |

OTHER PUBLICATIONS

International Search Report and Written Opinion for International Application No. PCT/US10/50272 dated Nov. 15, 2010.

Noise and Vibration Control Engineering: *Principles and Applications*, Edited by Leo Beranek and Instvan Ver, Chapter 11, John Wiley & Sons, Inc., 1002, (12 pages).

Handbook of *Acoustical Measurements and Noise Control*,Edited by Cyril Harris, Chapter 32; Structureborne Sound Isolation, Chapter 33; Noise Control in Buildings, McGraw-Hill, Inc., 1991, (36 pages).

"Green Glue is your soundproofing solution and noise reduction material", www.greengluecompany.com (2 pages).

Acoustical: *A Sound Approach to Testing*, www.archest.com/pages (2 pages).

STC—*Sound Transmission Class—Discussion and Use*, www.sota.ca/stc_info.htm (3 pages).

ASTM International, Designation: C 1396/C 1396M-04, *Standard Specification for Gypsum Board* (7 pages).

Barbara C. Lippiatt, National Institute of Standards and Technology. BEES 3.0, "*Building for Environmental and Economic Sustainability* Technical Manual and User Guide", Oct. 2002, (198 pages).

Takada, et al., *Effect in Reducing Floor Impact Noise of Recycled Paper Damper Members*, Bulletin of Tokyo Metropolitan Industrial Technology Research Institute, No. 2 (1999) [certified English translation] (13 pages).
*Architectural Acoustics*, M. David Egan, J. Ross Publishing (Reprint 2007) p. 211; originally published McGraw-Hill, 1988 (5 pages).
Hastings, Mardi C.; Godfrey, Richard; Babcock, G. Madison, *Application of Small Panel Damping Measurements to Larger Walls*, Proc. SPIE vol. 2720, p. 70-76, Smart Structures and Materials 1996: Passive Damping and Isolation (7 pages).
van Vuure, A.W.; Verpoest, I., Ko, F.K., *Sandwich-Fabric Panels as Spacers in a Constrained Layer Structural Damping Application*, Composites Part B 32 (2001) 11-19, Elsevier Science Ltd. (9 pages).
Noise and Vibration Control, Revised Edition, pp. 306-315, Institute of Noise Control Engineering, 1988, Beranek, Leo L. (editor) (9 pages).
Noise and Vibration Control, Chapter Fourteen, *Damping of Panels*, Ungar, Eric E., pp. 434-473, McGraw-Hill, 1971, Beranek, Leo L. (editor) (7 pages).
Noise and Vibration Control Engineering, *Principles and Application*, pp. 466-479, John Wiley & Sons, 1992, Beranek, Leo L. and Ver, Istvan L. (editors) (9 pages).
Nashif, Ahid D.; Jones, David I. G.; Henderson, John P., *Vibration Damping*, pp. 290-305, John Wiley & Sons, 1985 (18 pages).
Architectural Acoustics, Principles and Practice, John Wiley & sons, 1992, Cavanaugh, William J. and Wilkes, Joseph A. (editors) (332 pages).
FIRE Resistance Design Manual, Sound Control, Gypsum Association, GA-600-94 (14$^{th}$ Ed.) (107 pages).
FIRE Resistance Design Manual, Sound Control, Gypsum Association, GA-600-97 (15$^{th}$ Ed.) (120 pages).
FIRE Resistance Design Manual, Sound Control, Gypsum Association, GA-600-2000 (16$^{th}$ Ed.) (139 pages).
Noxon Arthur M., *The Chain is as Strong as its Weakest Link*, An article written for the first Hong Kong HiFi Show, 1993, Translated and Published in Chinese, http://www.acousticsciences.com/articles/chain.htm (7 pages).
*Quiet Lightweight Floor Systems*, Reprint from Sound and Vibration Magazine, Jul. 1992, by David A. Harris, Building & Acoustic Design Consultants (7 pages).
Joyal, Brian, *Constrained-Layer Systems Provide Weight-Efficient, High Level Damping* (4 pages).
Dynamat materials http://web.archive.org./web/20010525113753/www.admteschusa.com/Dynamat.html Jun. 12, 2007, ADM Tech—Dynamic Control (15 pages).
Noise Killer: Pro Damping Compound Materials http://www.tnt-audio.com/clinica/noise.html May 18, 2007, 1998 (3 pages).
Waybackmachine search results for Jan 1, 1996-Jun 12, 2007 (1 page).
Frankovich, David, *The Four-Fold Method of Noise and Vibration Control* (8 pages).
Renninger, Jennifer, *Understanding Damping Techniques for Noise and Vibration Control* (8 pages).
Unified Facilities Criteria (UFC) *Noise and Vibration Control*, UFC 3-450-01. May 15, 200, Department of Defense (156 pages).
United States Gypsum, *Architectural and Construction Services, Design Data for Acousticians*, Feb. 1986 (4 pages).
*A Study of Techniques to Increase the Sound of Insulation of Building Elements*, Wyle Laboratories, Prepared for Dept. of Housing and Urban Development, Jun. 1973 (12 pages).
dB-Ply materials Sound Reducing Panels from Greenwood Forest Products, Inc., Apr. 24, 1997 (9 pages).
dB-Rock materials OMNI Products, Inc. (3 pages).
ASC WallDamp materials from Acoustic Sciences Corporation http://web.archive.org/web/20021013031149/www.asc-soundproof.com/index-walldamp... May 18, 2007 (21 pages).
Sounddown Viscoelastic Glue DG-A2, Soundown Corporation (2 pages).
Nordisk Akustik A/S materials, http://web.archive.org/web/200206240933724/www.nordisk-akustik.dk/html_uk/prod03.ht... Jun. 11, 2007 (4 pages).
IES 2000 *Dampening and Visocelastic Membranes* (Jul. 2, 2003) Atlanta.com/product (pp. 1-6).
Waybackmachine search results for Jan. 1, 1996-May 3, 2006 (1 page).
"Damping of plate flexural vibrations by means of viscoelastic laminae" by D. Ross, E.E. Ungar, and E.M. Kerwin—Structural Damping, Section III, ASME, 1959, New York (41 pages).
PCT/US06/43247, Notification of Transmittal of the International Search Report and the Written Opinion of the International Searching Authority, or the Declaration (1 page).
PCT/US06/43247, International Search Report (3 pages).
PCT/US06/4247, Written Opinion of the International Searching Authority (5 pages).
Vandersall, H. L., "*Intumescent Coating Systems, Their development and Chemistry*" J. Fire & Flammability, vol. 2 (Apr. 1971) pp. 97-140 (45 pages).
English Language Abstract, JP Patent First Publication No. 09-203153, Aug. 5, 1997, (2 pages).
*A Study of Techniques to Increase the Sound of Insulation of Building Elements*, Wyle Laboratories, Prepared for Dept. of Housing and Urban Development, Jun. 1973 (16 pages).
*Field Sound Insulation Evaluation of Load-Beating Sandwich Panels for Housing*, Final Report, Prepared by Robert E. Jones, Forest Products Laboratory, Forest Service, U.S. Department of Agriculture, Aug. 1975 (53 pages).
*Sound Studies Construction on a Budget*, F. Alton Evererst, McGraw-Hill, 1997 (7 pages).
*Wood Handbook/Wood as an Engineering Material*, United States Department of Agriculture, Forest Service, General Technical Report FPL-GTR-113, Mar. 1999 (24 pages).
*Transmission Loss of Plasterboard Walls* by T. D. Northwood, Building Research Note, Division of Building Research, National Research Counsel, Ottawa, Canada (10 pages).
*A Guide to Airborne, Impact, and Structureborne Noise Control in Multifamily Dwellings*, U. S. Department of Housing and Urban Development, Prepared for the National Bureau of Standards, Washington, D. C., Jan. 1963 (5 pages).
*Transmission Loss of Leaded Building Materials*, Paul B. Ostergaard, Richmond L. Cardinell, and Lewis S. Goodfriend, The Journal of the Acoustical Society of America, vol. 35, No. 6, Jun. 1963 (7 pages).
*Dictionary of Architecture & Construction 2200 illustrations*, Third Edition, Edited by Cyril M. Harris, Professor Emeritus of Architecture Columbia University, McGraw-Hill, 2000 (7 pages).
*Dictionary of Engineering Materials*, Harald Keller, Uwe Erb, Wiley-Interscience by John Wiley & Sons, Inc. 2004 (4 pages).
*Chamber Science and Technology Dictionary*, by Professor Peter M. B. Walker, W & R Chambers Ltd and Cambridge University Press, 1988 (3 pages).
Pritz. "Loss Factor Peak of Viscoelastic Materials: Magnitude to Width Relations", J. of Sound and Vibration, 246(2): 265-280, 2001.
Spec-Data Quiet Solution Datasheet, Reed Construction Data, (2005).
Armstrong Basic Drywall Grid Installation Guide, http://web.archive.org/web/*/http://www.armstrong.com/common/c2002/content/files/4279.pdf. (Original Publication Date May 30, 2005, Retrieved Aug. 19, 2008).
www.acousticalsolutions.com/products/pdfs/install_green_glue.pdf. accessed Nov. 5, 2009. web date Jun. 19, 2006.
Cheng et al. "Vibration Attenuation of Panel Structures by Optimally Shaped Viscoelastic Coating with Added Weight Considerations". Thin-Walled Structures, 21 (1995), pp. 307-326.
AVS Forum "Green Glue(R)", http://www.aysforum.com/avs-vb/archive/index.php/t-456614-p-2.html, retrieved Jul. 19, 2010.

\* cited by examiner

RADIO FREQUENCY WAVE REDUCING MATERIAL AND METHODS FOR MANUFACTURING SAME

CROSS REFERENCE TO RELATED APPLICATIONS

This application is related to U.S. patent application Ser. No. 10/658,814 filed on Sep. 8, 2003, by Kevin J. Surace and Marc U. Porat, entitled "Acoustical Sound Proofing Material and Methods for Manufacturing Same", which is incorporated by reference herein in its entirety.

FIELD OF THE INVENTION

This invention relates to materials for improving the security of rooms and buildings and in particular to novel laminated construction materials which reduce radio frequency ("RF") signal transmission compared to the RF signal transmission through normal building materials thereby to prevent undesired RF signal transmission from or into the protected room or building.

BACKGROUND OF THE INVENTION

The security of information, such as that transmitted by radio frequency waves, is emerging as a privacy, economic, security, and anti-terrorism issue. In spite of security technologies such as data encryption, information may be surreptitiously obtained by sensing the emissions of keyboards, wireless mouse pointing devices, computer monitors, security systems and such. Unintended listeners may receive the emissions of telephone systems outside the user's premises. Employees may make calls with cell phones and inadvertently transmit background sounds or conversations. Some restaurants, theaters, churches and other public places want to prevent cell phones or pagers from being used. In some cases the information represented by the signals may not be important, but the signals themselves interfere with nearby sensitive equipment. Thus it is important in many circumstances to contain emissions within, and/or to prevent emissions from penetrating, a certain room or building.

Prior solutions have typically used electrically conducting materials, such as wire mesh or sheet metal, to enclose the volume of interest. The conducting materials are mechanically and electrically connected together and then grounded. Installation is done by building an enclosure a layer at a time. For example, one method in use today is to weld steel plates together on six sides of a room, with an opening for a door, typically steel. This method is labor intensive, requires a highly trained labor force, may require heavy duty material handling equipment, and the resulting structure slowly loses its RF shielding ability over time as small cracks develop in the welds due to building motion and/or settling.

In areas requiring high security it is also desirable to be able to detect attempts to penetrate the protected area to, for example, install a secret listening or viewing device.

Accordingly, what is needed is a new material and a new method of construction to reduce the transmission of RF signals into or out of an enclosure which allows easier construction, does not deteriorate over time, and is tamper resistant. The ability to simultaneously reduce acoustic energy (i.e. sound) transmission from or into the enclosure is also desirable.

SUMMARY OF THE INVENTION

In accordance with this invention, a new laminated structure and associated manufacturing process is provided which significantly improves the ability of a wall, ceiling, floor or door to reduce the transmission of RF waves from or into a room. As an added feature, the materials of this invention resist tampering.

The materials of the laminated structure of this invention are similar to those described in the aforementioned U.S. patent application Ser. No. 10/658,814, but with the center material (FIG. 1 and FIG. 2 of the application Ser. No. 10/658, 814) specified to be electrically conductive. As described in application Ser. No. 10/658,814, the outermost materials of the laminated structure of this invention (sometimes hereinafter referred to as a "panel" or "stack") may be gypsum, wood, or other suitable materials. Relative to the laminated structure described in application Ser. No. 10/658,814, one embodiment of the present invention further comprises a conductive tape which is in electrical contact with the electrically conductive center material and which extends beyond at least one end of the laminated structure by an amount which will allow the tape to be wrapped around at least one end or edge of the structure and attached to an exterior surface of the structure. When the resulting structure, which in one embodiment is typically provided in 4×8 foot sheets, is attached to electrically conductive metal studs by electrically conductive screws (typically metal) which penetrate the conductive center material, the panel is thereby electrically connected to the metal studs. The metal studs are electrically connected to ground potential.

In accordance with an embodiment of the invention, a strip of electrically conductive tape is used to cover the seam where two adjacent panels come together. The electrically conductive tape covering the seam is in electrical contact with the electrically conductive tape extending from the abutting edge of each panel (this last tape is further connected with the electrically conductive center material). As a result electrical connection is provided between all of the panels so connected, as well as to the metal studs. The electrically conductive materials of the panels so connected are at essentially the same potential and when grounded or held at a fixed potential the net effect is to mitigate any impinging RF waves.

Walls and ceilings are typically constructed using panels having gypsum outer layers; floors and doors are typically constructed with panels having wood for the outer layers. Of course, other appropriate materials can be used for the outer layers if desired.

Another embodiment of the invention provides for room construction using wood instead of metal studs or floor joists. The panels are installed on the wooden studs in a similar fashion to their installation on metal studs as described above, but with one or more shorting bars located on the studs at one or more predetermined locations such that the metal screws attaching the panels to the studs will penetrate the one or more shorting bars, which in turn are grounded. In one embodiment the screws are wired together across the back side of the panels.

In another embodiment the panels are installed in at least two courses (i.e. two or more layers) wherein the panels of the second (outer) course are staggered so as to cover up the seams between the pairs of abutting panels of a first inner course. The metal screws attaching the second course panels also penetrate the conductive layer of the panels of the first course, thereby electrically connecting all panels. By covering the seams between panels of the first course, the second course of panels prevents RF signals from leaking through the seams.

While in one embodiment tape is used to cover all seams in the multi-layer structure of panels, alternative embodiments of this invention using two or more layers of panels omit the additional strip of conductive tape between panels of the first course, or omit the additional strip of conductive tape between panels of the second course, or omit the additional strip of conductive tape between the panels of the first and second courses.

As an added benefit of this invention, the panels of this invention not only attenuate RF signals but also attenuate acoustic signals.

If desired, three or more courses of panels can be used as part of a wall or ceiling or floor and the additional strips of conductive tape which cover the seams between abutting panels of each course can be omitted selectively from one or more of the courses.

An advantage of this invention is that the panels are all electrically connected together and to ground and seams between adjacent panels in each layer of panels are sealed either by electrically conductive tape or by an additional course of panels placed over the seams or by both tape and the additional course of panels.

BRIEF DESCRIPTION OF THE DRAWINGS

This invention will be described in more detail in conjunction with the following detailed description taken together with the drawings.

DETAILED DESCRIPTION OF THE INVENTION

Definition of Terms:

| | |
|---|---|
| DCID 6/9 | A directive from the Director of the Central Intelligence (DCI) titled: Physical Security Standards for Sensitive Compartmented Information Facilities |
| PSA | Pressure sensitive adhesive. |
| RF | Radio frequency waves. |
| SCIF | Sensitive Compartmented Information Facility: An accredited area, room, group of rooms, buildings, or installation where Sensitive Compartmented Information ("SCI") may be stored, used, discussed, and/or processed. SCIF performance requirements and design details are given in DCID 6/9. |
| WIFI | "Wireless fidelity": popular term for a high-frequency wireless local area network (WLAN). |
| PANEL | A laminated structure constructed in accordance with the present invention. The panel may be further attached to a structure defining a room or a wall. |

Figure 1:
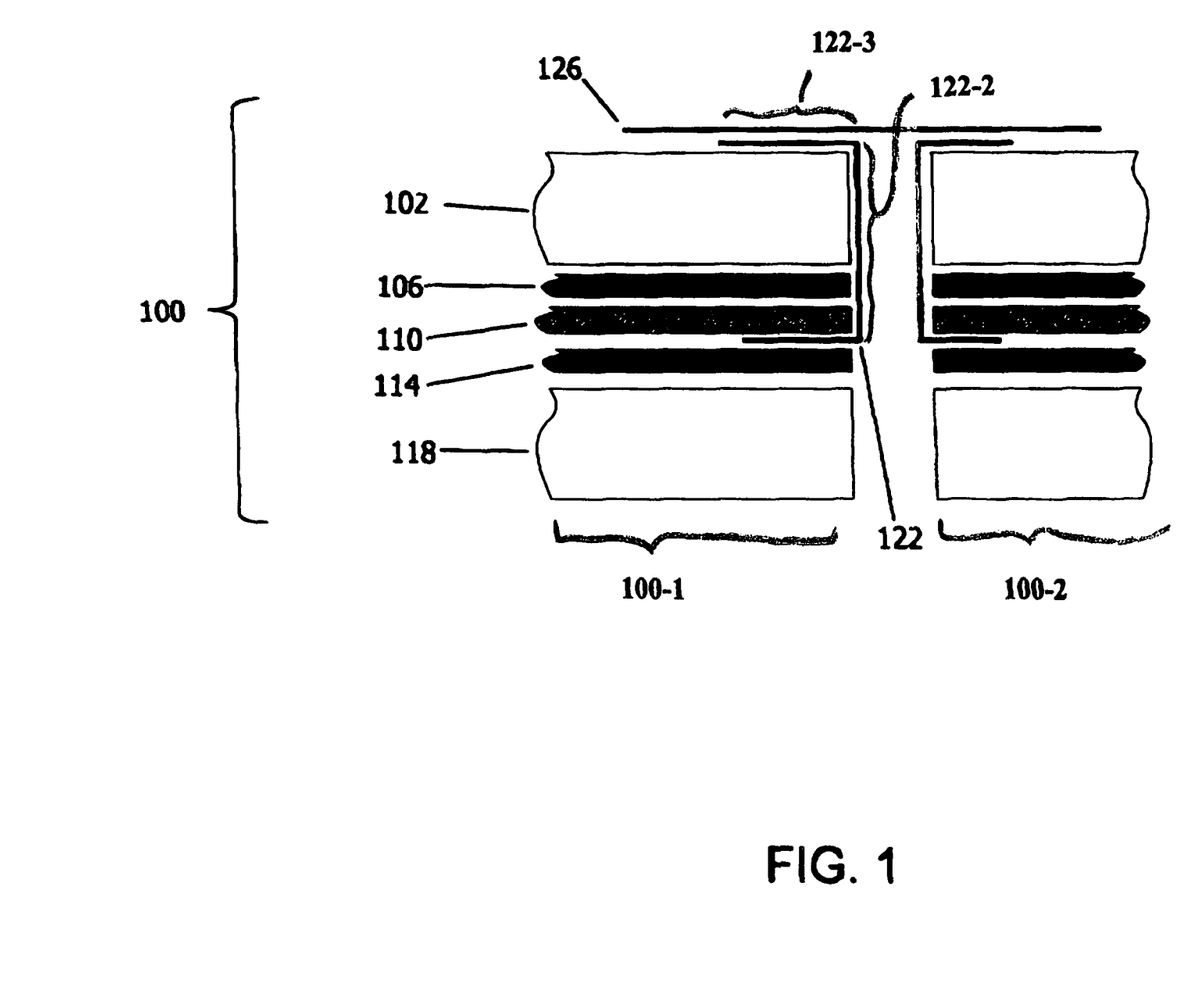
FIG. 1 shows a laminated structure fabricated in accordance with this invention for reducing the transmission of RF through the structure.

The structure of FIG. 1 is an example of the laminated structure of one embodiment of the present invention. The layers in the structure will be described from the top to the bottom with the structure oriented horizontally as shown. It should be understood, however, that the laminated structure of this invention will be oriented vertically when placed on vertical walls and doors, as well as horizontally or even at an angle when placed on ceilings and floors. Therefore, the reference to top and bottom layers is to be understood to refer only to these layers as oriented in FIG. 1 and not to the actual use of this structure wherein this structure may be placed vertically, horizontally, or at an angle between vertical and horizontal. A detailed discussion of the method of construction and the materials of the laminated structure of FIG. 1 and various alternative embodiments is given in the aforementioned U.S. patent application Ser. No. 10/658,814 and is not repeated here.

In FIG. 1, a portion of two adjacent panels 100-1 and 100-2 is shown. Note that the spaces shown between the layers and the edges of the panels are for illustrative purposes only. References to the "center material" or "center layer", as in layer 110 of FIG. 1, are understood to mean the "electrically conductive layer" of the laminated layers of a panel, whether or not this layer is physically in the center. For example, in some embodiments the conductive layer is last in the stack of layers. As described in U.S. patent application Ser. No. 10/658,814, top layer 102 is glued to a center layer 110 using a thin viscoelastic adhesive 106. The material of layer 110 is selected for its electrical conduction properties. In one embodiment, the conductive material of center layer 110 is a sheet of metal, such as silicon steel plus copper. In other embodiments center layer 110 can be a copper alloy or aluminum, or a steel sheet with an adjacent copper wire mesh, mu metal or the like. The thickness of the conductive layer 110 may be as thin as foil or up to about a half-inch thick, selected for a certain purpose depending upon the degree of rigidity, acoustic damping, RF signal transmission reduction or physical security desired. In one embodiment the conductive center layer 110 is conductive paint or conductive adhesive.

A conductive tape 122, such as 3M-1345 obtained from 3M Manufacturing, is attached to the center layer. The tape that is preferred for use with this invention to seal the cracks between abutting panels is 3M-1345 tape which is described by 3M as "embossed tin-plated copper foil shielding tape". As described in the 3M data sheet, this tape "consists of an embossed 1-ounce deadsoft tin-plated copper foil backing and an aggressive pressure-sensitive acrylic adhesive. The edges of the embossed pattern pressed into the foil cut through the adhesive layer to establish reliable metal-to-metal contact between the backing and the application substrate." This tape is available in standard and custom widths and lengths. Widths vary from ¼ inch to 23 inches. This tape is intended for use in "applications requiring excellent electrical conductivity from the application substrate through the adhesive to the foil backing. Common uses include grounding and EMI shielding in equipment, components, shielded rooms . . . [and similar structures]. The tin plating on the copper coil backing facilitates soldering and improves resistance to oxidation and discoloration." The 3M data sheet reports that "typical shielding effectiveness (far field) is in the range of 75 dB to 95 dB (30 MHz to 1 GHz)."

In accordance with this invention, the tape applied to the edges of the panels is long enough to extend completely along (i.e. to "span") each edge of a panel (such as the edge which extends perpendicular to the plane of the paper in FIG. 1) and is sufficiently wide such that a portion (122-2 and 122-3) of the tape 122 extends out from the edge far enough to be pulled around to the top surface of layer 102 as shown in FIG. 1. The conductive tape 122 may have on one surface thereof a PSA for convenience of construction. The PSA provides for the electrically conductive material of the tape to make electrical contact with a portion of a surface of electrically conductive layer 110 by rolling or otherwise applying pressure to the tape. The conductive tape is applied to and extended along at least the major (longer) edges of a panel. In some embodiments the conductive tape is applied to all edges. In another embodiment conductive tape 122 is replaced by a metal channel or strip. The channel or strip is sized to extend along an edge of a panel in electrically conductive contact with the center conductor 110 with a portion of the channel strip extending out from the edge and being bent to contact the front surface, as described above and in FIG. 1 in conjunction with tape. The formed metal channel or strip is fastened to the layers of the structure using rivets, screws, PSA, or other electrically conductive attachment means.

If desired, a slight indentation can be provided in the portion of the surface of electrically conductive layer 110 to which the tape 122 or metal channel/strip is attached to make the outer surface of the tape 122 or metal channel/strip flush with the adjacent surface of layer 110.

A thin layer of viscoelastic glue 114 is applied to the lower surface of center layer 110 so as to attach the center layer 110 to the bottom laminated layer 118. In one embodiment layers 114 and 118 are omitted so that layer 110 is visible and is one external side of the panel 100.

Upon installation, for example attaching 4×8 foot panels side by side to a wall, another layer 126 of conductive tape is affixed over the seam between the panels as shown in FIG. 1. Tape 126 electrically connects the tapes 122 of adjoining panels. Of course, in an actual structure, the tapes 122 of abutting panels will ideally be in physical contact.

Figure 2:
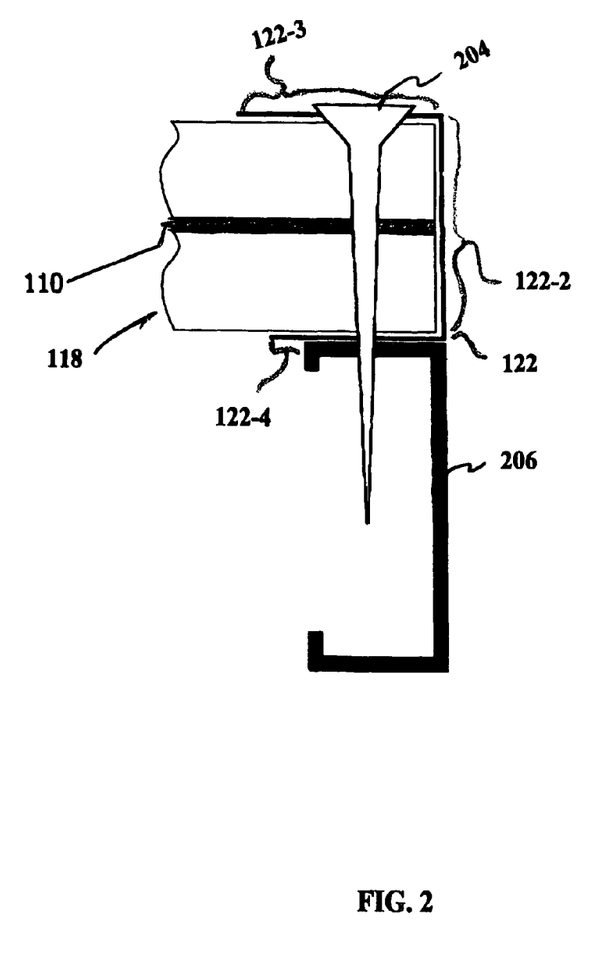
FIG. 2 shows another embodiment of a laminated panel fabricated in accordance with this invention and a method for attachment of the panel to a metal stud.

The dimensions of a room utilizing panels constructed according to the invention may not be the same as the dimensions of one or more panels. Panels may be cut to any arbitrary size. However, such cutting exposes an edge of the laminated structure without conductive tape 122. Referring to FIG. 2, conductive tape 122 is applied to extend over and along the edge exposed by cutting the panel so as to cover completely this edge. The edges 122-3 and 122-4 of the tape 122 are bent ninety degrees (90°) back over the panel 100 so as to electrically connect these edges to the edge-adjacent portions of the front and back surfaces of the panel 100. An electrically conductive metal screw 204 is inserted through the top portion 122-3 of tape 122, conductive layer 110, and metal stud 206, as shown in FIG. 2. A portion 122-4 of tape 122 may extend far enough across the bottom of layer 118 (110 in some embodiments) for screw 204 to penetrate this portion of tape 122. The center portion 122-2 of tape 122 electrically contacts the edge of center layer 110 exposed by cutting.

In one embodiment, stud 206 may be of a nonconductive material and screws 204 may be grounded by other means, such as an electrically conductive strip of material 402 (FIG. 4) extending along the face of the nonconductive stud 206 but in electrical contact with screw 204 and electrically grounded or held at a fixed potential.

Figure 3:
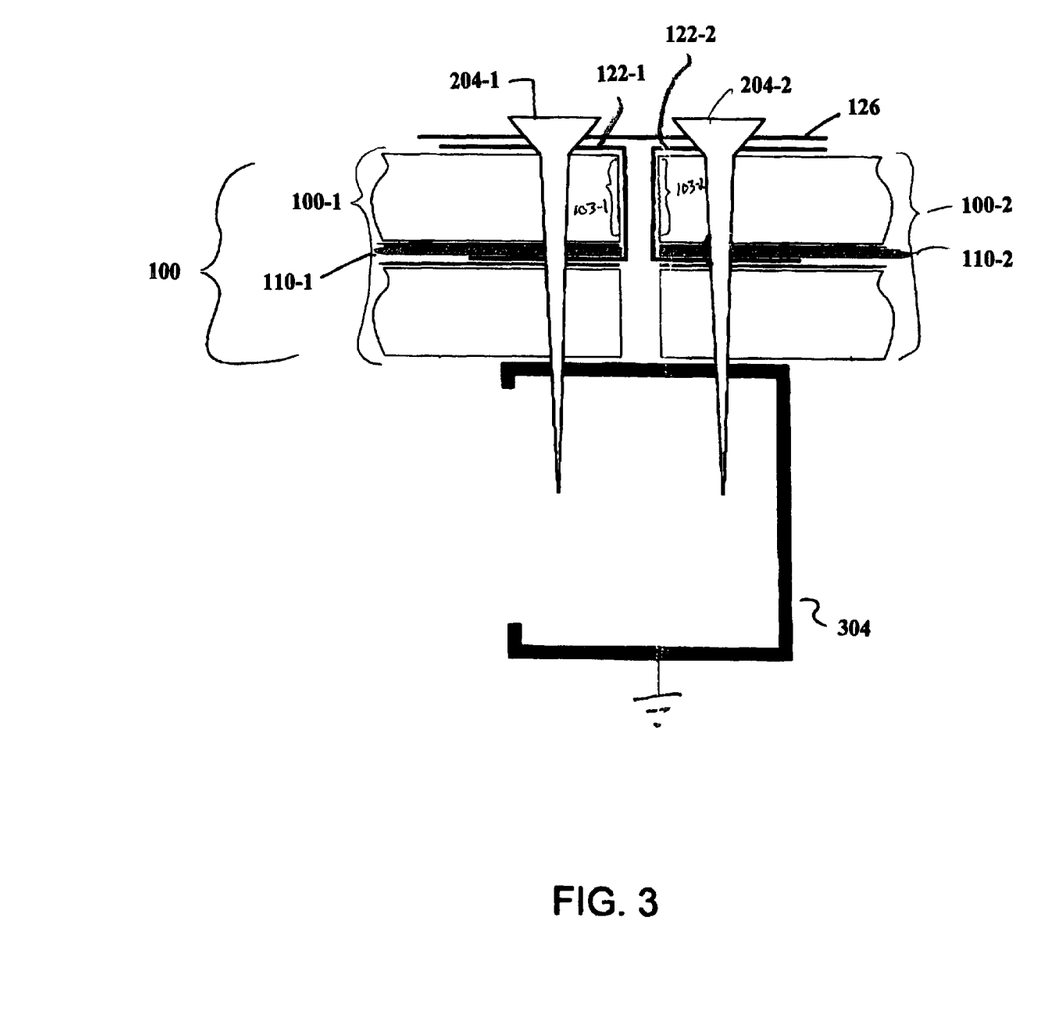
FIG. 3 shows a method for attaching adjoining panels to a metal stud.

FIG. 3 illustrates one installation of two panels 100-1 and 100-2 shown mounted with adjacent edges of the two panels 100-1 and 100-2 abutting and attached to a single metal stud 304. A metal screw 204-1 attaches the laminated panel 100-1 to stud 304. Screw 204-1 penetrates center layer 110-1, thus completing an electrical connection between the center layer 110-1 and the grounded stud 304. The space shown between the edges of panels 100-1 and 100-2 is for ease of explanation and, of course, does not exist in the actual structure.

Panel 100-2 is similarly attached to stud 304 by means by metal screw 204-2. Metal screw 204-2 again penetrates through electrically conductive tape 126 and through panel center layer 110-2 of panel 100-2 extending into metal stud 304. Thus the center layer 110-1 of panel 100-1 is electrically connected via electrically conductive metal screw 204-1, electrically conductive metal stud 304 and electrically conductive metal screw 204-2 to center layer 110-2 of panel 100-2 and the two panels will be at the same electrical potential. In addition, electrically conductive tape 126 is placed over the two edges 103-1 and 103-2 of panels 100-1 and 100-2. While screws 204-1 and 204-2 are shown as having their heads external to tape 126, in an alternative embodiment these screws will have their heads covered by tape 126 and in some embodiments the heads will be countersunk into the panels 100-1 and 100-2 so that the tops of the heads are flush with the surfaces of these panels. Tape 126 will then lie flat over these countersunk heads. Electrically conductive tapes 122-1 and 122-2 of the panels 100-1 and 100-2 will be in electrically conducting contact with each other when the panels 100-1 and 100-2 are mounted on stud 304 such that edges 103-1 and 103-2 are in physical contact with each other (i.e. directly abut). The structure of FIG. 3 thus ensures that panels 100-1 and 100-2 are electrically grounded and at the same electrical potential thereby to effectively reduce if not eliminate RF transmissions through these panels from one side to the other.

Figure 4:
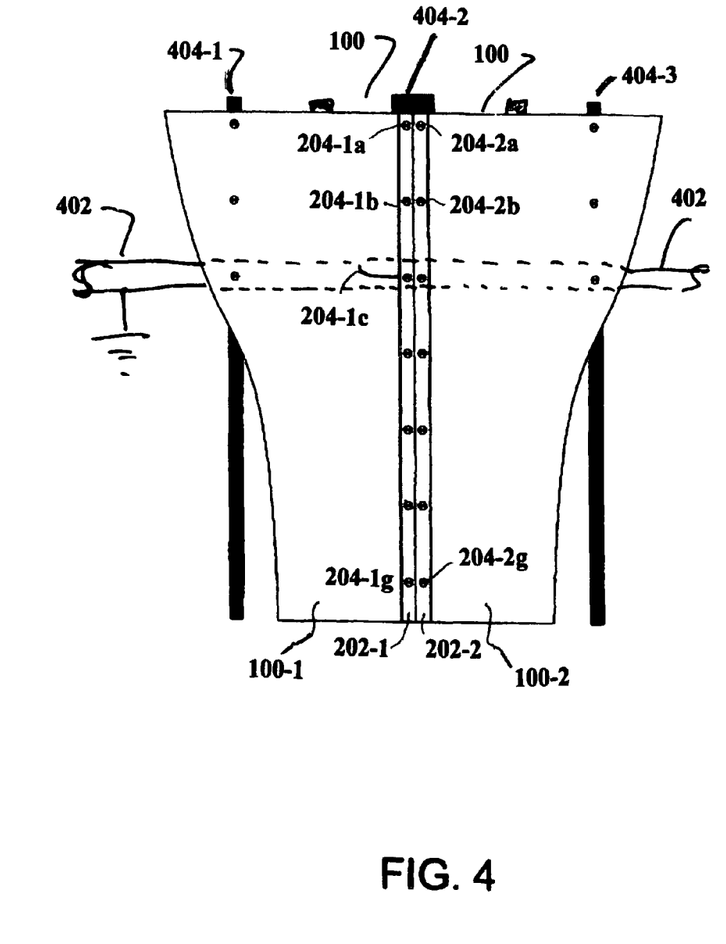
FIG. 4 shows a method of attaching panels to a conductive, grounded shorting bar and non-conducting studs.

Referring to FIG. 4, in one embodiment wood studs 404 shown in side view are substituted for metal studs. A grounded conductive shorting bar 402 is arranged behind panels 100-1 and 100-2 and at least one metal screw 204 per panel 100 connects the center layer 110 (not shown) to shorting bar 402. In another embodiment at least one metal screw 204 per panel 100 is wired to ground.

In an alternative embodiment to that shown in FIG. 4, the grounded conductive shorting bar 402 can be replaced by a vertical electrically conductive shorting bar (not shown) placed along each wooden stud such that screws 204-1a through 204-1g through panel 100-1 go through the electrically conductive shorting bar running parallel to and attached to the stud 404-2. In this case, a separate electrical connection connecting each of the individual electric shorting bars can be provided although in one embodiment such electrical connection is inherently provided by center layer 110 of each panel 100.

Furthermore, as shown in FIG. 4, a plurality of metal screws 204-1a through 204-1g are used to attach panel 100-1 to center stud 404-2. Likewise, a similar plurality of electrically conductive metal screws 204-2a through 204-2g are used to attach panel 100-2 to the same stud 404-2. As shown in FIG. 4, panels 100-1 and 100-2 are attached to stud 404-2 such that the directly adjacent edges of these panels covered respectively by tapes 202-1 and 202-2 mounted along the edges of the panels as described above, directly abut and therefore are in electrically conductive contact with each other. To ensure, however, that these tapes 202-1 and 202-2 are at the same potential, the electrically conductive screws 204-1a through 204-1g and 204-2a through 204-2g connect the tapes 202-1 and 202-2 to the center layers 110-1 and 110-2 within panels 100-1 and 100-2 respectively via grounding bars. Grounding bars 402 mounted horizontally across the studs 404-1, 404-2 and 404-3 as shown in FIG. 4 are perpendicular to each of the studs 404-1 through 404-3 and ensure that the panels such as 100-1 and 100-2 are at essentially the same electrical potential at all points within the panels.

Although not shown in FIG. 4, electrically conductive tape 126 can be placed over the seam between panels 100-1 and 100-2 shown in FIG. 4 to extend along the edge portions of tapes 202-1 and 202-2 which are visible in FIG. 4 so as to cover these edge portions and the electrically conductive screws 204-1a through 204-1g and 204-2a through 204-2g.

Figure 5:
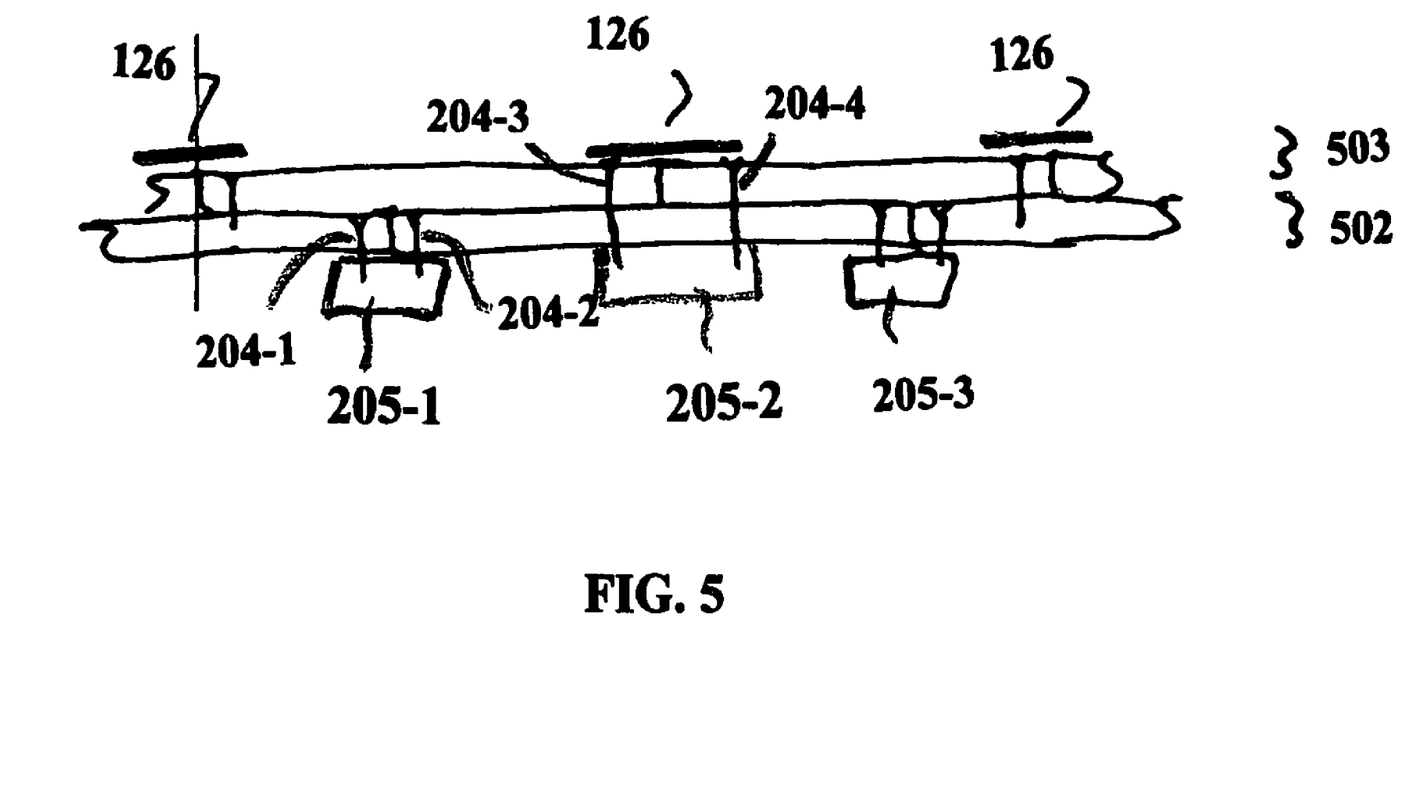
FIG. 5 shows a method of attaching multiple courses of panels to metal studs.

Referring to FIG. 5, an alternative construction is shown. To further attenuate any RF which might escape through the seams between two panels assembled, for example, in accordance with FIG. 3, two courses 502 and 503 of panels are utilized. A first course 502 of panels is secured to a stud assembly (per FIG. 1 or FIG. 3) using screws 204. Tape 126 (shown over a seam between screws 204-3 and 204-4) is applied over each seam and also over the heads of countersunk screws in the middles of the second, outer, course of panels as shown in FIG. 5. In one embodiment tape 126 is omitted from the first course 502 of panels. The second, outer course 503 of panels is secured over the first course 502. The screws 204 of the second course 503 are at least long enough to penetrate the center layer 110 of the panels of the first, inner, course 502, thereby providing an electrical connection between the two courses. The first course 502, having previously been physically and electrically connected to the studs, provides a grounding connection for the second course 503. In one embodiment, the screws 204 of the second course are long enough to also make a direct electrical connection with the studs 205-1, 205-2 and 205-2 and to assist in holding both courses on the studs. Conductive tape 126 is applied over the seams of adjacent panels in the second course 503. In one embodiment tape 126 is omitted.

Alternatively, tape 126 can be applied over all seams of both the first course 502 and the second course 503 if desired. The tape 126 when so applied will be pressed by the compressive forces generated by screws 126 being extended into the underlying studs such that the resulting structure is sufficiently rigid to provide structural integrity and to attenuate if not eliminate all RF transmissions through the wall.

In some embodiments other construction is used instead of studs. For example, the invention may be practiced by placing panels which have wood or other appropriate material for their outer layers upon foam, the foam being over a concrete floor. A foam thickness of ¼ to ½ inch is recommended. The panels are electrically connected to each other using in one embodiment electrically conductive strips of material placed on or in the foam as well as to the walls, all of which are held at a fixed potential, typically ground, thus providing the RF shielding effect. The foam improves the attenuation of sound. Other structures for electrically grounding the floor panels will be obvious to those skilled in the electrical arts.

The center material 110 of each panel may be selected not only for electrical properties but for physical strength as well. For example, a center material made of a certain thickness of sheet steel provides resistance to a blast, bullets, or other projectiles. Such a material also resists secretive drilling of a hole for the insertion of a sensing device, or at least makes such a penetration obvious upon inspection.

The laminated structure described provides a panel which may be handled by two people. Depending upon the material selected for center layer 110, the panel may be cut with a conventional circular saw using blades intended for cutting wood. An RF attenuating room constructed using panels produced by practicing the invention is easier to construct and enjoys a lower total cost than equivalent solutions available today.

The laminated structure of the invention is consistent with some embodiments of the invention disclosed in U.S. patent application Ser. No. 10/658,814. Accordingly, panels constructed according to the present invention will attenuate sound as described in application Ser. No. 10/658,814.

Table 1 shows the estimated RF and acoustic attenuation provided by enclosures constructed using panels constructed in accordance with the present invention.

TABLE 1

| Assembly method of room | RF attenuation | Acoustic Standard Achieved using single studs | Acoustic standard achieved using double studs |
| --- | --- | --- | --- |
| Single layer of panels for walls, ceiling and floor | up to 95 dB | STC 54 | STC 66 |
| Double overlapping panels for walls, ceiling and floor | up to 120 dB | STC 60 | STC 74 |

Panels constructed in accordance with the present invention, using a minimum 0.011 inch thick steel plate for center material 110, are believed to be compliant with DCID6/9.

Figure 7:
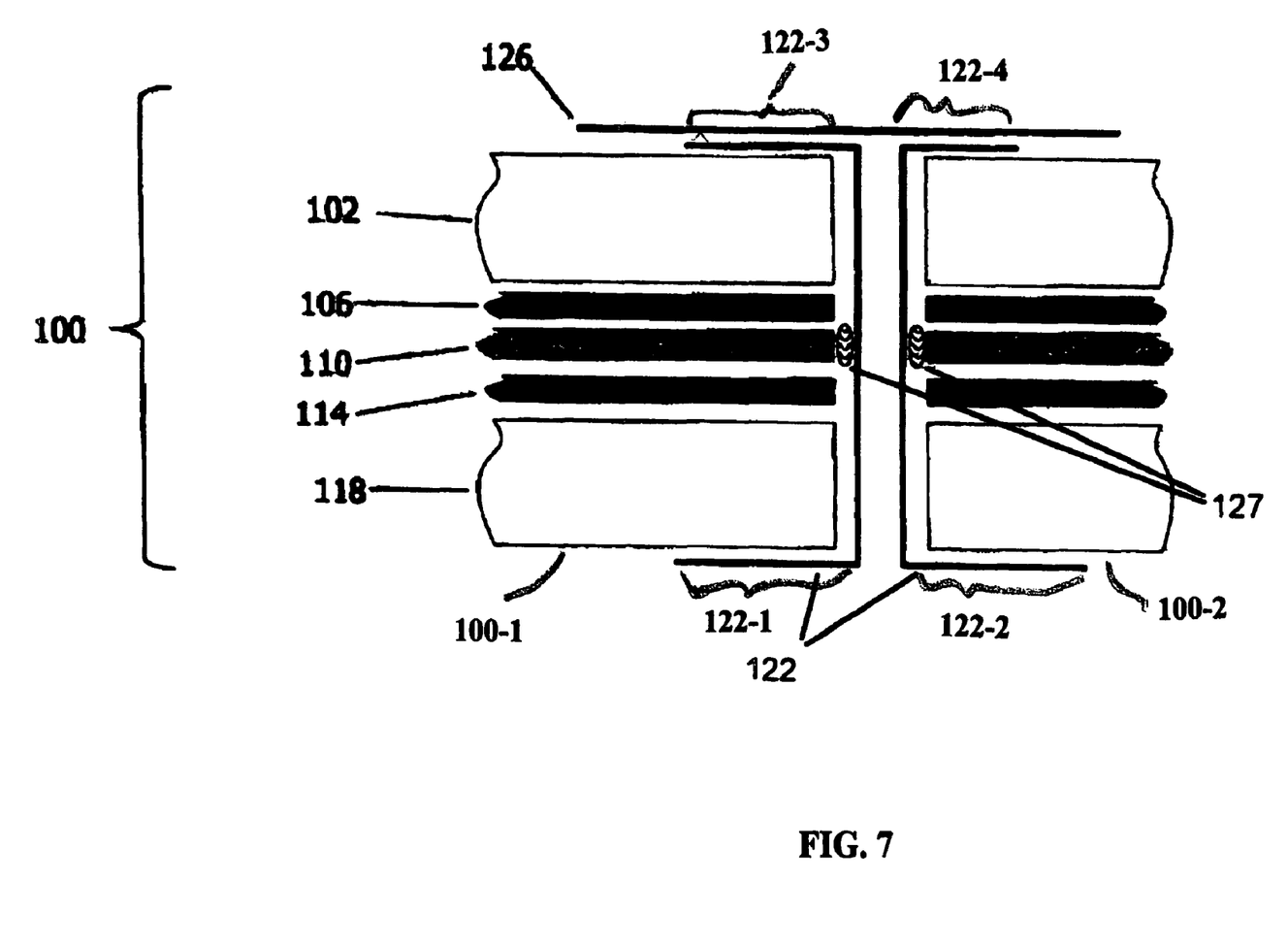
FIG. 7 shows an embodiment of this invention for electrically contacting a cut edge on a panel.

While the invention has been described in conjunction with complete panels as manufactured at the plant, in practice, panels will have to be cut on site to fit the particular sizes intended to be covered. When this is done, tape will not exist on the edge on the panel which is exposed by the cut. While FIG. 2, described above, shows one solution to this problem, another solution is shown in FIG. 7. As shown in FIG. 7, a conductive cord 127 fabricated of a mixture of butyl and nickel-coated carbon slivers or nickel filings inserted into the butyl up to about 80% by weight, is placed on the exposed metal edge of the internal electrically-conductive metal layer 110 in the panel. Once the butyl cord containing adequate conductive filings has been placed over the edge, a conductive tape 122 can then be placed over both the butyl cord and the remainder of the edge exposed by the cut. Each conductive tape 122 has one or two edge portions such as portions 122-1 and 122-3 which extend beyond the panel edge and thus can be folded over onto the adjacent portions of the surfaces of the panel. When two panels so cut are then abutted against each other as shown in FIG. 7 (the space between the panels and the conductive tapes 122 on the edges of the panels is exaggerated for illustrative purposes) then a third conductive tape 126 can be placed over the seam between the panels 100-1 and 100-2 to electrically contact the bent edges 122-3 and 122-4 of the conductive tape on the edges thereby to ensure that the entire structure is at a fixed potential such as electrical ground. Such a structure then is highly effective in preventing the transmission of RF signals.

The conductive cord has been found by experiment to require approximately 80% by weight of the conductive metal filings such as conductive nickel filings or nickel-coated carbon slivers in order to be electrically conductive and thereby ensure that the internal electrically conductive metal layer 110 is at approximately the same potential (preferably ground) as the electrically conductive tape 122. Other electrically-conductive metals can also be used, if desired, in cord 127. As a result, the invention is capable of being used with cut panels as well as with prefabricated panels having the conductive tape already in contact with the internal electrically conductive layer 110. As described above, a portion of the edge-connected conductive tape will extend beyond the panel for ease of electrical contact.

Figure 6A:
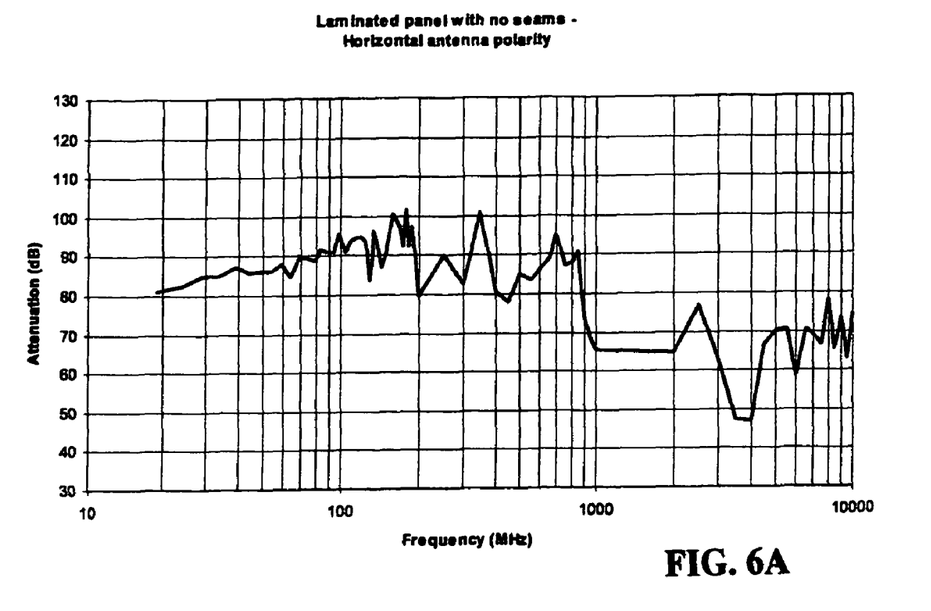
FIGS. 6A through 6H are graphs showing the attenuation ability of the laminated panels of this invention as a function of the frequency of the signals being attenuated.

The effectiveness of this invention in reducing the transmission of RF signals through walls is shown in FIGS. 6A through 6H. FIGS. 6A through 6H show the attenuation as a function of frequency of the RF signal varying from 19 MHz to 10 GHz for different structures identified at the top of each figure. Thus, FIG. 6A shows the attenuation for a laminated panel with no seams and horizontal antenna polarity to range from 80 dB at approximately 20 MHz to 100 dB just below 200 MHz and then dropping to between 60 to 70 dB at 1 GHz. Beyond 1 GHz the attenuation is shown to be relatively flat with negative and positive spikes as a function of frequency.

Figure 6B:
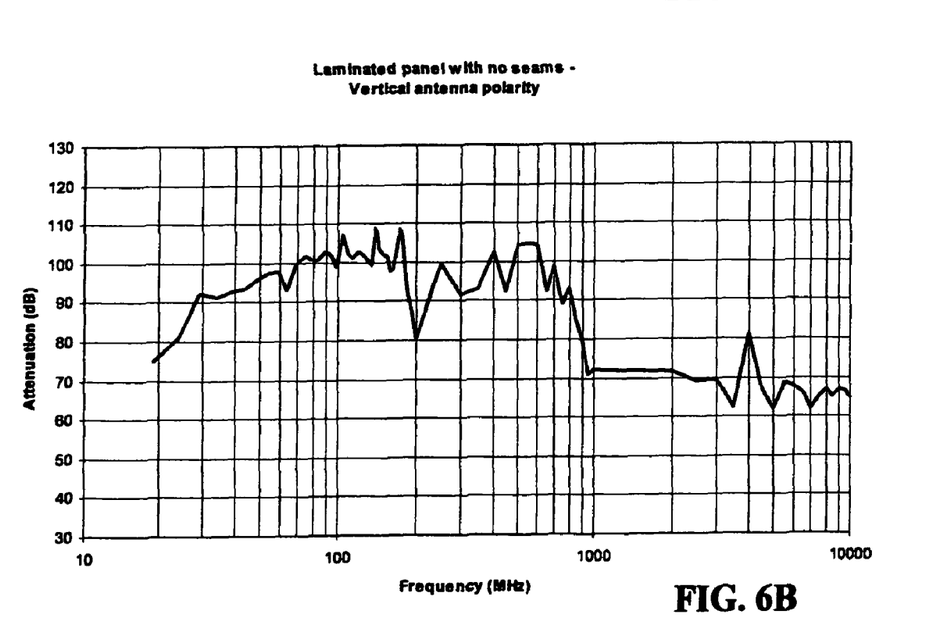

FIG. 6B shows the attenuation for a laminated panel with no seams and vertical antenna polarity. The attenuation varies from approximately 76 dB at 20 MHz to as high as over 100 dB in the range of 100 MHz to about 180 MHz dropping in a spike back to 80 dB at 200 MHz and then remaining between 90 and 110 dB until approximately 800 MHz thereafter dropping to approximately 70 dB between 1 GHz and 10 GHz.

Figure 6C:
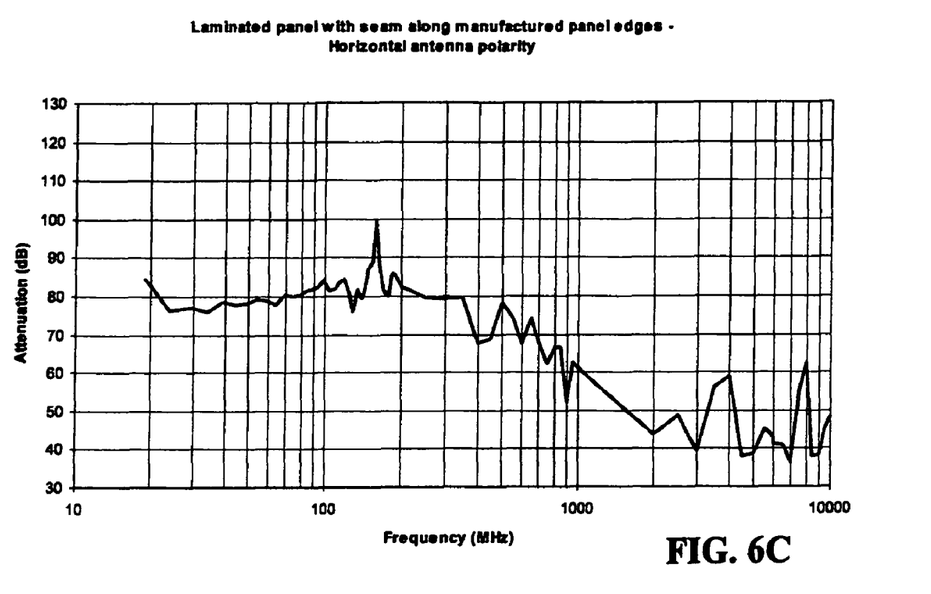

FIG. 6C shows the RF signal attenuation for a laminated panel with a seam along the manufactured panel edges and horizontal antenna polarity. This structure shows attenuation varying from a little better than 80 dB at 20 MHz down to about 40 dB in the range of about 4½ GHz to 7 GHz.

Figure 6D:
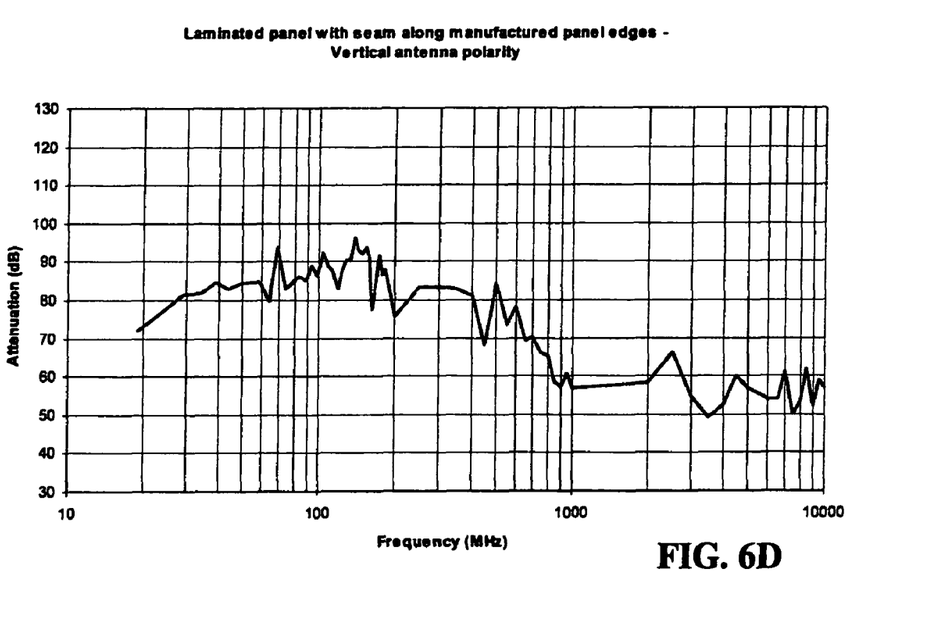

FIG. 6D shows the RF signal attenuation for a laminated panel with a seam along the manufactured panel edges with a vertical antenna polarity which has the attenuation varying from a little over 70 dB at 20 MHz to approximately 80 to 90 dB in the range of 100-200 MHz and then dropping to approximately between 50 dB and 60 dB in the 1 GHz to 10 GHz range.

Figure 6E:
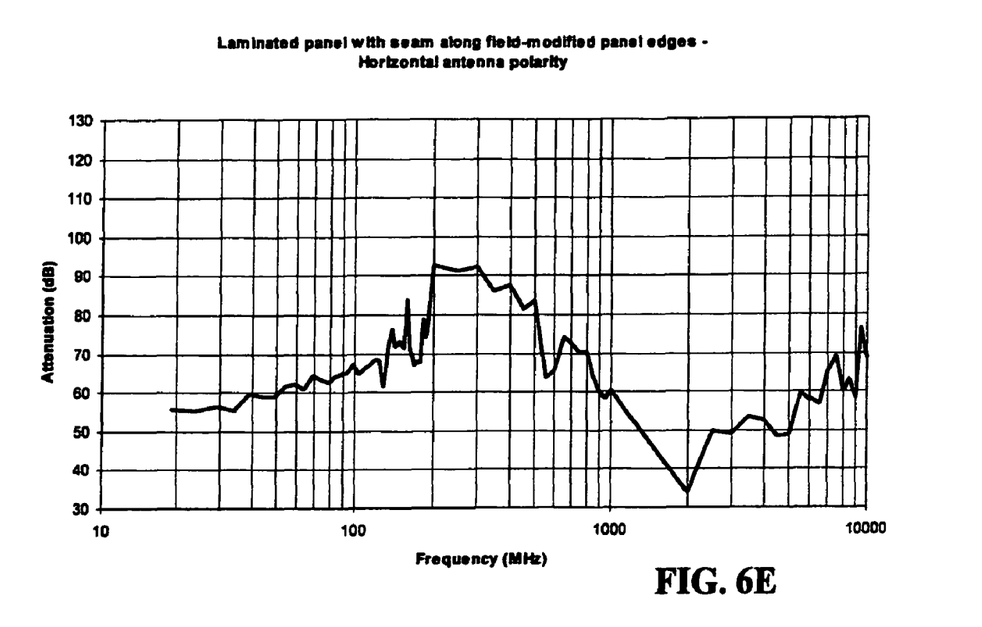

FIG. 6E shows the RF signal attenuation for a laminated panel with the seam along field modified panel edges and horizontal antenna polarity. The attenuation varies from between 50 dB and 60 dB for a frequency of 20 MHz to as high as 90 dB for a frequency of 200 MHz and then drops to a value of approximately 35 dB attenuation for 2 GHz climbing to approximately 70 dB attenuation for between 9 GHz and 10 GHz.

Figure 6F:
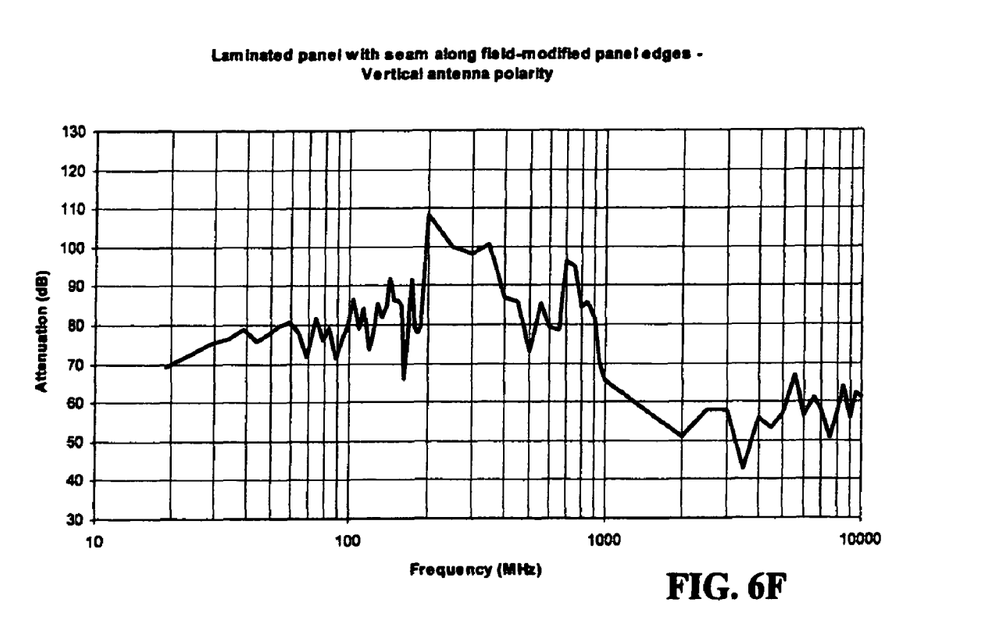

FIG. 6F shows the RF signal attenuation associated with a laminated panel with a seam along field modified panel edges and vertical antenna polarity. The attenuation varies from 70 dB at 20 MHz to as high as 100 dB at approximately 200 MHz and then drops with certain spikes to as low as approximately 43 dB between 3 and 4 GHz.

Figure 6G:
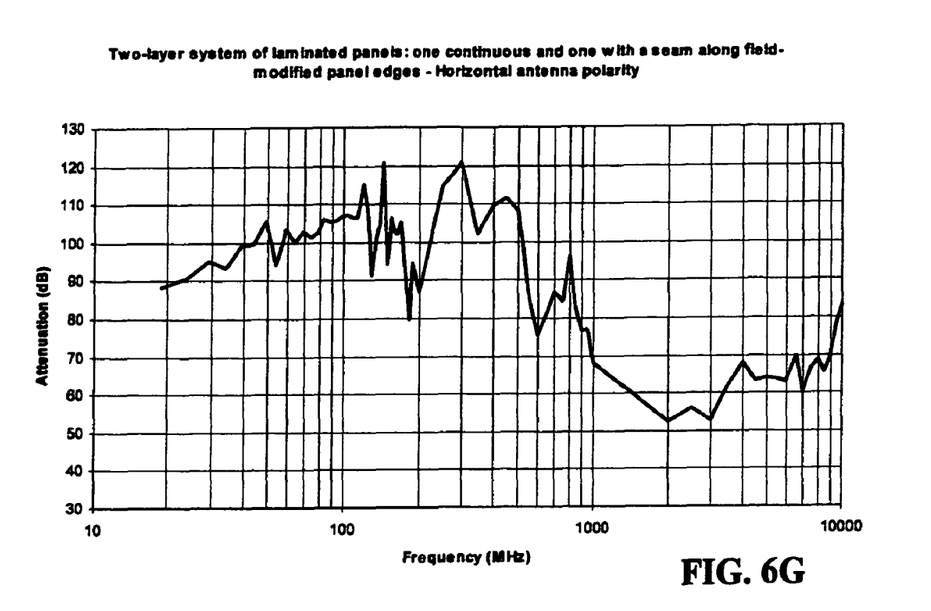

FIG. 6G shows the RF signal attenuation associated with a two-layer system of laminated panels, one continuous and one with a seam along field modified panel edges and with horizontal antenna polarity. The attenuation is shown to be much better using this structure than in some of the previous structures, varying from approximately 89 dB attenuation at 20 MHz to as high as 120 dB at 300 MHz and dropping to between 50 dB and 60 dB in the range of 2 GHz to 3 GHz and then rising again to approximately 82 dB or 83 dB at 10 GHz.

Figure 6H:
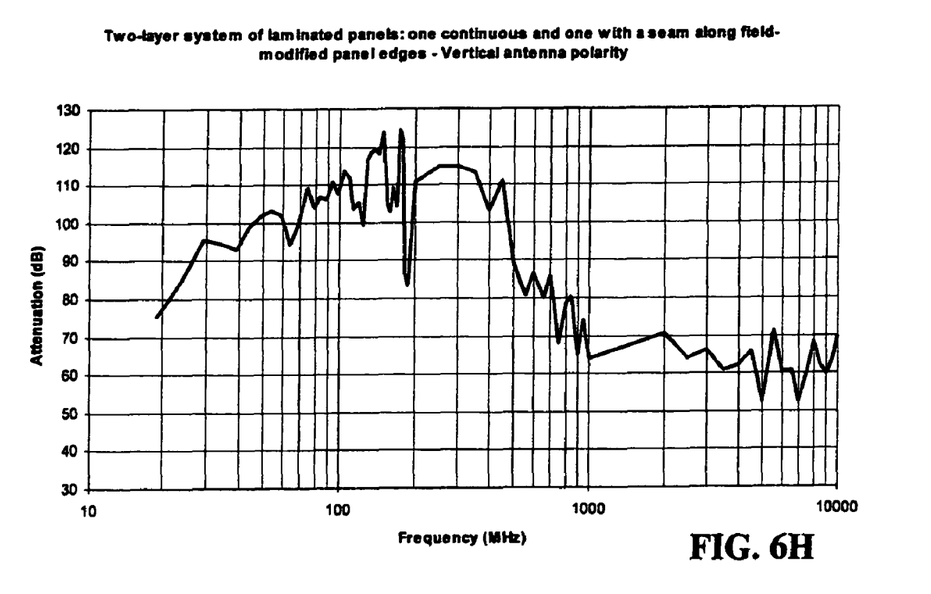

FIG. 6H shows the RF signal attenuation associated with a two-layer system of laminated panels structured in accordance with this invention, one continuous panel covering a seam in an underlying layer of panels created by abutting two field modified panel edges (such as shown in FIGS. 2 and 7) using vertical antenna polarity. The attenuation varies from about 77 dB at 20 MHz up to a peak of between 105 to 120+ dB at approximately 150 mHz to 170 MHz with some gradual drop to within the range of 52 dB to 70 dB for signals with a frequency of 1 GHz to 10 GHz.

As can be seen from FIGS. 6A to 6H, the structure of this invention significantly attenuates RF signals in frequency ranges commonly used with many types of communication systems.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, and/or use of equivalent functional steps for steps described herein. Such variations are to be considered within the scope of what is contemplated here. For example, while the described structures are shown as rectangular in shape, structures with other shapes, such as circular, hexagonal or other polygonal shapes can also be used, if required or appropriate. This invention is not limited to any particular shape.

Thus the invention is not limited to the embodiments described above.

The following claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A laminated structure used for constructing RF attenuating walls, floors, or ceilings comprising:
   two external layers of a material;
   at least one internal electrically conductive constraining layer;
   two or more internal layers of a viscoelastic glue separated by said at least one internal electrically conductive constraining layer; and
   an electrically conductive tape in electrical contact with said electrically conductive constraining layer and extending out from at least one edge of said structure, said electrically conductive tape being in direct contact with an exposed outer surface of the laminated structure and having an edge laminated between the two external layers of a material.

2. A laminated structure as in claim 1, wherein the constraining layer comprises metal.

3. A laminated structure as in claim 1, wherein said two external layers each comprise a selected thickness gypsum board layer.

4. A laminated structure as in claim 3, wherein said glue comprises a viscoelastic material capable of damping sound.

5. A laminated structure as in claim 4, wherein said internal constraining layer comprises a sheet metal layer of selected thickness.

6. A laminated structure as in claim 5, wherein said internal metal layer comprises a sheet metal layer of selected thickness selected to resist physical tampering.

7. A laminated structure as in claim 5, wherein said sheet metal layer of selected thickness comprises galvanized steel.

8. A laminated structure as in claim 1, wherein at least one of said two external layers comprises a selected thickness wood layer.

9. A laminated structure as in claim 8, wherein said glue comprises a viscoelastic material capable of damping sound.

10. A laminated structure as in claim 9, wherein said internal constraining layer comprises a sheet metal layer of selected thickness.

11. A laminated structure as in claim 10, wherein said internal metal layer comprises a sheet metal layer of selected thickness selected to resist physical tampering.

12. A laminated structure as in claim 10, wherein said sheet metal layer of selected thickness comprises galvanized steel.

13. A laminated structure having four edges used for constructing RF attenuating walls, floors, or ceilings comprising:
- at least one internal constraining layer of a selected material;
- two internal layers of a viscoelastic glue, one such layer on each side of said internal layer;
- at least one additional layer of material on the exposed side of each internal layer of viscoelastic glue; and
- an external conductive tape which is in electrical contact with the internal constraining layer extending along at least one of said edges and having a portion of said tape extending out from said at least one edge, being in direct contact with an exposed outer surface of the laminated structure and having an edge laminated between the two external layers of a material.

14. A laminated structure as in claim 13, wherein the constraining layer comprises metal.

15. A laminated structure as in claim 13, wherein at least one of said two external layers comprises a selected thickness gypsum board layer.

16. A laminated structure as in claim 15, wherein said glue comprises a viscoelastic material capable of damping sound.

17. A laminated structure as in claim 16, wherein said internal constraining layer comprises a sheet metal layer of selected thickness.

18. A laminated structure as in claim 17, wherein said internal metal layer comprises a sheet metal layer of selected thickness selected to resist physical tampering.

19. A laminated structure as in claim 17, wherein said sheet metal layer of selected thickness comprises galvanized steel.

20. A laminated structure as in claim 13, wherein at least one of said two external layers comprises a selected thickness wood layer.

21. A laminated structure as in claim 20, wherein said glue comprises a viscoelastic material capable of damping sound.

22. A laminated structure as in claim 21, wherein said internal constraining layer comprises a sheet metal layer of selected thickness.

23. A laminated structure as in claim 22, wherein said internal metal layer comprises a sheet metal layer of selected thickness selected to resist physical tampering.

24. A laminated structure as in claim 22, wherein said sheet metal layer of selected thickness comprises galvanized steel.

25. A laminated structure used for constructing RF attenuating walls, floors, or ceilings which comprises:
- a layer of first electrically conductive material having two surfaces;
- a layer of viscoelastic glue on one surface of said layer of first material;
- a layer of a second material over said viscoelastic glue; and
- an electrically conductive tape attached to said electrically conductive material such that a portion of said electrically conductive tape is in contact with an exposed surface of said structure and having an edge laminated between the layer of first electrically conductive material and the layer of a second material.

* * * * *